United States Patent
Michigami et al.

(10) Patent No.: US 11,838,006 B2
(45) Date of Patent: Dec. 5, 2023

(54) ACOUSTIC WAVE DEVICE, BAND PASS FILTER, DUPLEXER, AND MULTIPLEXER

(71) Applicant: Murata Manufacturing Co., Ltd., Nagaokakyo (JP)

(72) Inventors: Akira Michigami, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 451 days.

(21) Appl. No.: 17/223,057

(22) Filed: Apr. 6, 2021

(65) Prior Publication Data
US 2021/0226608 A1 Jul. 22, 2021

Related U.S. Application Data

(63) Continuation of application No. PCT/JP2019/040884, filed on Oct. 17, 2019.

(30) Foreign Application Priority Data

Oct. 18, 2018 (JP) ................. 2018-196266

(51) Int. Cl.
*H03H 9/56* (2006.01)
*H03H 9/13* (2006.01)
(Continued)

(52) U.S. Cl.
CPC .............. *H03H 9/568* (2013.01); *H03H 9/13* (2013.01); *H03H 9/17* (2013.01); *H03H 9/70* (2013.01)

(58) Field of Classification Search
CPC ............ H03H 9/568; H03H 9/13; H03H 9/17; H03H 9/70; H03H 9/725; H03H 9/02574; H03H 9/1457; H03H 9/14541
See application file for complete search history.

(56) References Cited

U.S. PATENT DOCUMENTS 6,278,219 B1 8/2001 Kaneda et al.
2002/0163402 A1* 11/2002 Tsuzuki ............. H03H 9/02795
333/195
(Continued)

FOREIGN PATENT DOCUMENTS

JP 2000-165184 A 6/2000
JP 2000-165484 A 6/2000
(Continued)

OTHER PUBLICATIONS

Official Communication issued in International Patent Application No. PCT/JP2019/040884, dated Dec. 17, 2019.

*Primary Examiner* — Andrea Lindgren Baltzell
*Assistant Examiner* — Kimberly E Glenn
(74) *Attorney, Agent, or Firm* — Keating & Bennett, LLP

(57) ABSTRACT

An acoustic wave device includes a piezoelectric substrate including a piezoelectric layer made of lithium tantalate, an IDT electrode on the piezoelectric substrate, and a pair of reflectors on both sides of the IDT electrode on the piezoelectric substrate in an acoustic wave propagation direction. SH waves are used as a principal mode. The IDT electrode includes electrode fingers and the pair of reflectors each including electrode fingers. When a length along a direction orthogonal to a direction in which the electrode fingers extend is a width, each of the reflectors includes first and second electrode fingers having different widths. Four consecutive electrode fingers, which are any four of the electrode fingers of each of the reflectors, include both of the first and second electrode fingers and distances between centers of the four consecutive electrode fingers are equal or substantially equal.

18 Claims, 8 Drawing Sheets

(51) Int. Cl.
*H03H 9/17* (2006.01)
*H03H 9/70* (2006.01)

(56) References Cited

U.S. PATENT DOCUMENTS

| | | |
|---|---|---|
| 2003/0169129 A1 | 9/2003 | Takamine |
| 2008/0136555 A1* | 6/2008 | Schmidhammer ..... H03H 9/725 333/129 |
| 2015/0102705 A1 | 4/2015 | Iwamoto et al. |
| 2016/0294361 A1 | 10/2016 | Yamane et al. |
| 2018/0226952 A1 | 8/2018 | Tanaka et al. |
| 2019/0296714 A1 | 9/2019 | Eihama |

FOREIGN PATENT DOCUMENTS

| | | |
|---|---|---|
| JP | 2001-332954 A | 11/2001 |
| JP | 2003-289234 A | 10/2003 |
| JP | 2013-183224 A | 9/2013 |
| JP | 2017-076903 A | 4/2017 |
| JP | 2018-129683 A | 8/2018 |
| WO | 2013/191122 A1 | 12/2013 |
| WO | 2015/098756 A1 | 7/2015 |
| WO | 2018/117231 A1 | 6/2018 |
| WO | 2018/181111 A1 | 10/2018 |

* cited by examiner

ACOUSTIC WAVE DEVICE, BAND PASS FILTER, DUPLEXER, AND MULTIPLEXER

CROSS REFERENCE TO RELATED APPLICATIONS

This application claims the benefit of priority to Japanese Patent Application No. 2018-196266 filed on Oct. 18, 2018 and is a Continuation Application of PCT Application No. PCT/JP2019/040884 filed on Oct. 17, 2019. The entire contents of each application are hereby incorporated herein by reference.

BACKGROUND OF THE INVENTION

1. Field of the Invention

The present invention relates to an acoustic wave device, a band pass filter, a duplexer, and a multiplexer.

2. Description of the Related Art

Acoustic wave devices have been widely used for filters of cellular phones and so forth. In International Publication No. 2015/098756, one example of the acoustic wave devices is disclosed. In this acoustic wave device, an interdigital transducer (IDT) electrode is provided on a LiTaO$_3$ film with a cut angle equal to or larger than 30° and equal to or smaller than 60°. On both sides of the IDT electrode in an acoustic wave propagation direction, reflectors are provided. This acoustic wave device uses an SH wave as a principal mode.

The inventors of preferred embodiments of the present application have studied a problem in which, in an acoustic wave device which uses an SH wave as a principal mode, a response due to Rayleigh waves, which are unwanted waves, occurs in a frequency band near 0.75 times as large as the resonant frequency of the principal mode. When a response due to Rayleigh waves occurs, that response may cause deterioration in attenuation characteristics and reflection characteristics of the acoustic wave device. However, in the description of International Publication No. 2015/098756, this problem is not recognized, and therefore a spurious response due to Rayleigh waves cannot be sufficiently suppressed.

SUMMARY OF THE INVENTION

Preferred embodiments of the present invention provide acoustic wave devices, band pass filters, duplexers, and multiplexers that are each capable of reducing or preventing a spurious response due to Rayleigh waves.

An acoustic wave device according to a preferred embodiment of the present invention includes a piezoelectric substrate including a piezoelectric layer made of lithium tantalate, an IDT electrode on the piezoelectric substrate, and paired reflectors on both sides of the IDT electrode on the piezoelectric substrate in an acoustic wave propagation direction. SH waves are used as a principal mode. The IDT electrode includes a plurality of electrode fingers and the reflectors each include a plurality of electrode fingers. When a length along a direction orthogonal or substantially orthogonal to a direction in which the electrode fingers extend is a width, the reflector includes a first electrode finger and a second electrode finger having different widths. Four consecutive electrode fingers, which are any four of the plurality of electrode fingers of the reflector, include both of the first electrode finger and the second electrode finger and distances between centers of the four consecutive electrode fingers are equal or substantially equal.

A band pass filter according to a preferred embodiment of the present invention includes a plurality of acoustic wave resonators including a series arm resonator and a parallel arm resonator, and at least one of the plurality of acoustic wave resonators is an acoustic wave device according to a preferred embodiment of the present invention.

A duplexer according to a preferred embodiment of the present invention includes an antenna terminal connected to an antenna, and a first band pass filter and a second band pass filter connected in common to the antenna terminal and having different pass bands. At least one of the first band pass filter and the second band pass filter is a band pass filter according to a preferred embodiment of the present invention.

A multiplexer according to a preferred embodiment of the present invention includes an antenna terminal connected to an antenna, and a plurality of band pass filters connected in common to the antenna terminal and having different pass bands. At least one of the plurality of band pass filters is a band pass filter according to a preferred embodiment of the present invention.

According to preferred embodiments of the present invention, it is possible to provide acoustic wave devices, band pass filters, duplexers, and multiplexers that are each capable of reducing or preventing a spurious response due to Rayleigh waves.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In the following, the present invention is clarified by describing preferred embodiments of the present invention with reference to the drawings.

Note that each preferred embodiment described in the specification is an exemplary preferred embodiment and partial replacement or combination of structures can be made among different preferred embodiments.

Figure 1:
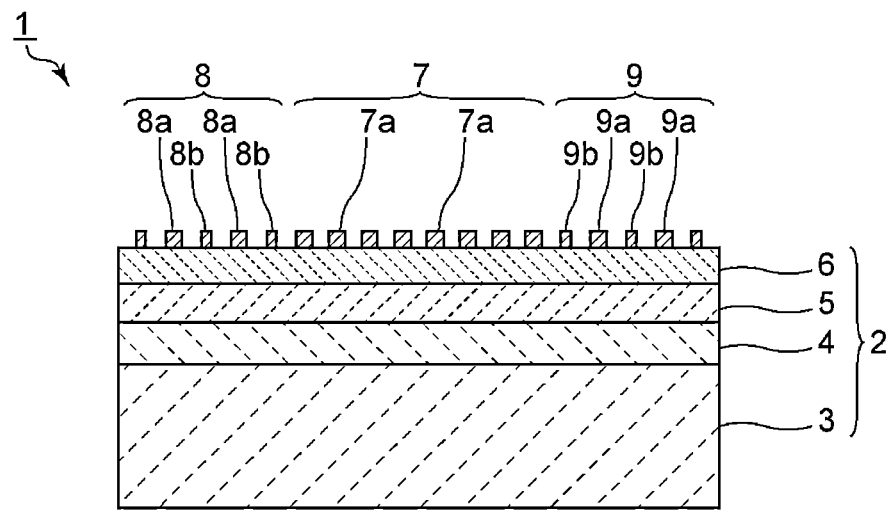
FIG. 1 is a schematic elevational sectional view of an acoustic wave device according to a first preferred embodiment of the present invention.

FIG. 1 is a schematic elevational sectional view of an acoustic wave device according to a first preferred embodiment of the present invention.

An acoustic wave device 1 includes a piezoelectric substrate 2. The piezoelectric substrate 2 includes a support substrate 3, a high acoustic velocity film 4 provided on the support substrate 3, a low acoustic velocity film 5 provided on the high acoustic velocity film 4, and a piezoelectric layer 6 provided on the low acoustic velocity film 5. The piezoelectric layer 6 is preferably, for example, a lithium tantalate film with a cut angle being Y cut 55°. Note that the structure of the piezoelectric substrate 2 is not limited to the above and, for example, the piezoelectric substrate 2 may include only the piezoelectric layer 6. In this case, the piezoelectric substrate 2 is preferably, for example, a lithium tantalate substrate.

On the piezoelectric layer 6 of the piezoelectric substrate 2, an IDT electrode 7 is provided. The IDT electrode 7 includes a plurality of electrode fingers 7a. With alternating voltage applied to the IDT electrode 7, acoustic waves are excited. The acoustic wave device 1 uses SH waves as a principal mode. When SH waves are used as a principal mode, in a frequency band in the vicinity of 0.75 times as large as the resonant frequency of the principal mode, a spurious response due to Rayleigh waves occurs. Note that, for example, when SH waves are used as a principal mode, if Euler angles of the piezoelectric layer 6 are denoted as $(\varphi, \theta, \psi)$, the Euler angles are preferably in a range of about $-10°<\varphi<$about $10°$, about $60°<\theta<$about $175°$, and about $-10°<\psi<$about $10°$.

A pair of reflector 8 and reflector 9 are provided on both sides of the IDT electrode 7 on the piezoelectric layer 6 in an acoustic wave propagation direction. The reflector 8 and the reflector 9 each include a plurality of electrode fingers. In this manner, the acoustic wave device 1 of the present preferred embodiment is an acoustic wave resonator.

The low acoustic velocity film 5 of the piezoelectric substrate 2 is a film having a relatively low acoustic velocity. More specifically, the acoustic velocity of bulk waves propagating through the low acoustic velocity film 5 is lower than the acoustic velocity of bulk waves propagating through the piezoelectric layer 6. The low acoustic velocity film 5 preferably includes, for example, silicon oxide denoted by $SiO_x$ as a main component. x is any positive integer value. In the present preferred embodiment, the low acoustic velocity film 5 is preferably a $SiO_2$ film, for example. Note that the material of the low acoustic velocity film 5 is not limited to the above and a medium including any of the following materials as a main component can also be used, such as, for example, silicon oxide, glass, silicon oxynitride, tantalum oxide, or a compound with fluorine, carbon, or boron added to silicon oxide.

The high acoustic velocity film 4 is a film having a relatively high acoustic velocity. More specifically, the acoustic velocity of bulk waves propagating through the high acoustic velocity film 4 is higher than the acoustic velocity of acoustic waves propagating through the piezoelectric layer 6. In the present preferred embodiment, the high acoustic velocity film 4 is preferably a silicon nitride film, for example. Note that the material of the high acoustic velocity film 4 is not limited to the above and a medium including any of the following materials as a main component can also be used. Such as, for example, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a diamond-like carbon (DLC) film, diamond, and so forth.

The support substrate 3 is preferably, for example, a silicon substrate in the present preferred embodiment. Note that the material of the support substrate 3 is not limited to the above and the following can also be used, such as, for example, piezoelectric bodies such as aluminum oxide, diamond, lithium tantalate, lithium niobate, and quartz; various ceramics such as alumina, magnesia, silicon nitride, aluminum nitride, silicon carbide, zirconia, cordierite, mullite, steatite, and forsterite; dielectrics such as sapphire and glass; semiconductors such as gallium nitride; resin; and so forth.

In the present preferred embodiment, the acoustic wave device 1 includes the piezoelectric substrate 2, which is a multilayer body including the support substrate 3, the high acoustic velocity film 4, the low acoustic velocity film 5, and the piezoelectric layer 6 laminated in this order. With this, energy of acoustic waves can be effectively trapped on a piezoelectric layer 6 side.

Figure 2:
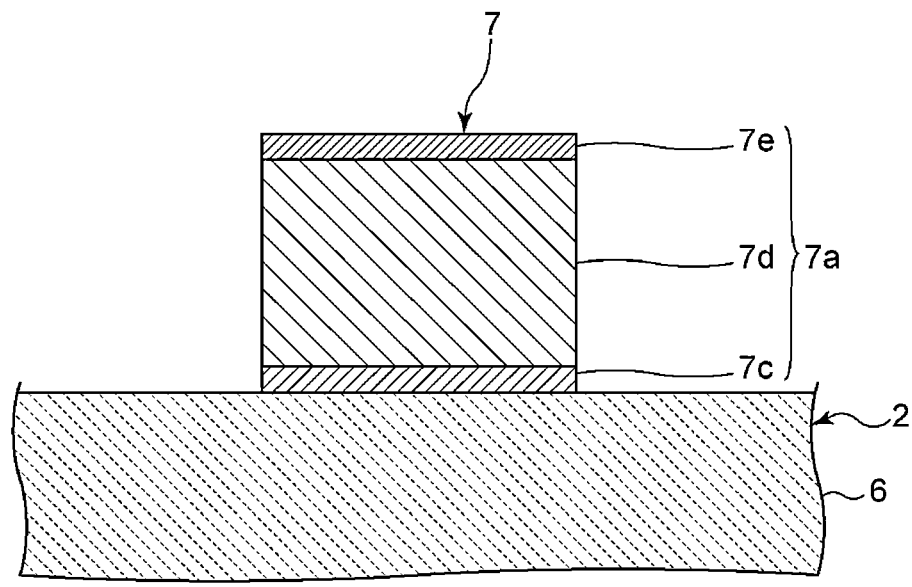
FIG. 2 is an enlarged schematic elevational sectional view showing the vicinity of an electrode finger of an interdigital transducer (IDT) electrode in the first preferred embodiment of the present invention.

FIG. 2 is an enlarged schematic elevational sectional view showing the vicinity of an electrode finger of an IDT electrode in the first preferred embodiment.

The IDT electrode 7 is defined by a multilayer metal film including a first metal layer 7c, a second metal layer 7d, and a third metal layer 7e laminated in this order from a piezoelectric substrate 2 side. Preferably, the first metal layer 7c is a Ti layer, the second metal layer 7d is an Al layer, and the third metal layer 7e is a Ti layer, for example. In the present preferred embodiment, the reflector 8 and the reflector 9 are also each defined by a multilayer metal film the same as or similar to that of the IDT electrode 7. Note that the material and the number of layers of the IDT electrode 7, the reflector 8, and the reflector 9 are not limited to the above. Alternatively, the IDT electrode 7, the reflector 8, and the reflector 9 may each be defined by a single-layered metal film.

Figure 3:
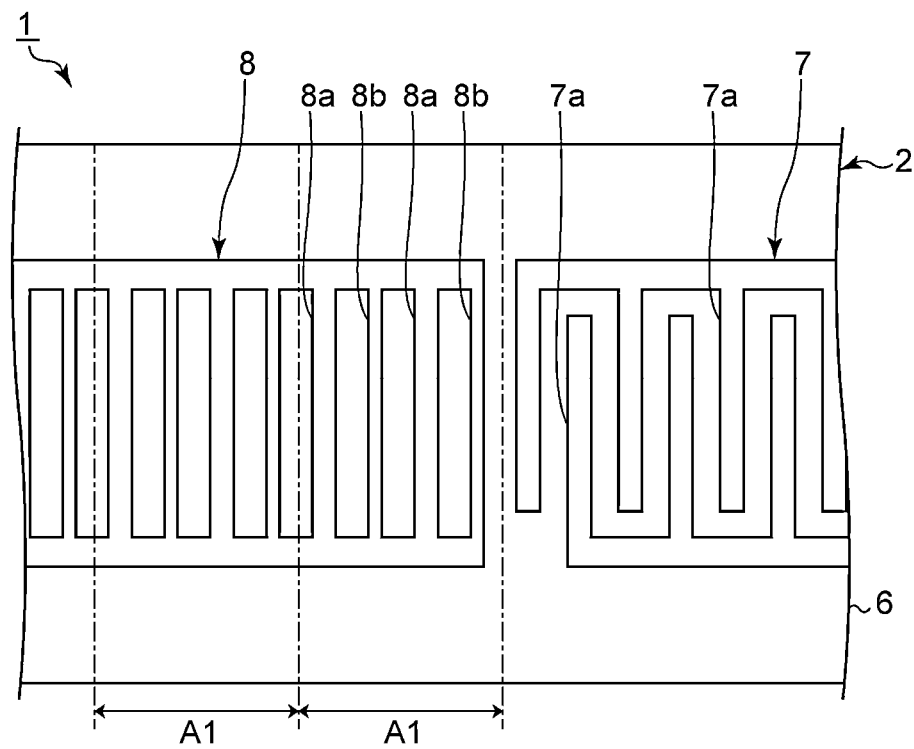
FIG. 3 is a schematic plan view showing a portion of the IDT electrode and a reflector in the first preferred embodiment of the present invention.
Figure 4:
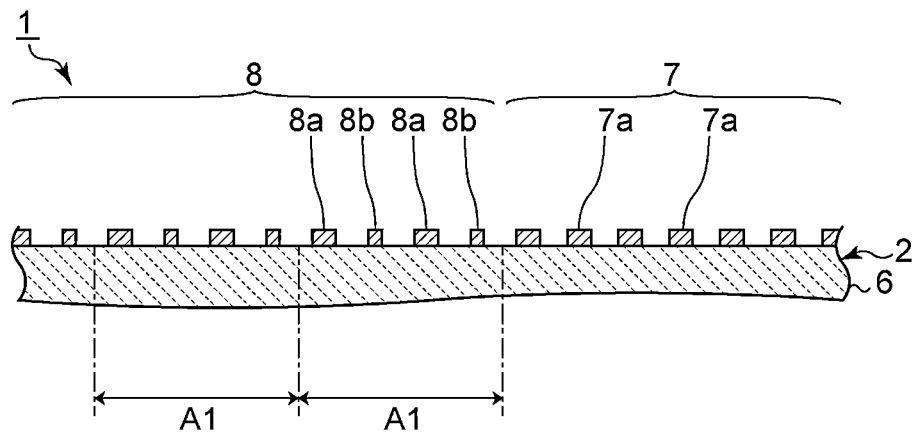
FIG. 4 is a schematic elevational sectional view showing a portion of the IDT electrode and the reflector in the first preferred embodiment of the present invention.

FIG. 3 is a schematic plan view showing a portion of the IDT electrode and the reflector in the first preferred embodiment. FIG. 4 is a schematic elevational sectional view showing a portion of the IDT electrode and the reflector in the first preferred embodiment.

As shown in FIG. 3, when the length along a direction orthogonal or substantially orthogonal to a direction in which the electrode fingers extend is the width of the electrode fingers, widths of the electrode fingers 7a of the IDT electrode 7 are all equal or substantially equal. Distances between centers of the electrode fingers of the IDT electrode 7 are all equal or substantially equal. The distance between centers of electrode fingers is a direct distance connecting the center points of adjacent electrode fingers included in the IDT electrode 7 in the widths of the electrode fingers. When a plurality of electrode fingers are included in the IDT electrode 7, the distance between centers of electrode fingers indicates an average value of distances between centers of adjacent electrode fingers. Note that the widths of the electrode fingers 7a of the IDT electrode 7 may not necessarily all be equal or substantially equal and the distances between the centers of the electrode fingers may not necessarily all be equal or substantially equal. In the specification, the widths or the distances between centers of electrode fingers that are equal or substantially equal are assumed to include an error due to variations in manufacturing or variations within manufacturing tolerances.

As shown in FIG. 3 and FIG. 4, the plurality of electrode fingers of the reflector 8 include a first electrode finger 8a and a second electrode finger 8b having different widths. The first electrode finger 8a and the second electrode finger 8b are alternately arranged. Here, when an array of a set of consecutive four electrode fingers of the reflector 8 including the first electrode finger 8a and the second electrode finger 8b is an array A1 of a set of electrode fingers, arrays A1 of sets of electrode fingers of the reflector 8 are periodically arranged.

Here, that the arrays A1 of sets of electrode fingers are periodically arranged includes the case in which the arrays A1 of sets of electrode fingers are consecutively arranged and the case in which the arrays A1 of sets of electrode fingers are periodically arranged with one or more electrode fingers therebetween. In the present preferred embodiment, the arrays A1 of sets of electrode fingers are consecutively arranged.

Note that the arrangement of the electrode fingers of the reflector 8 is not limited to the above and it is only required that four consecutive electrode fingers, which are any four of the electrode fingers of the reflector 8, include both of the first electrode finger 8a and the second electrode finger 8b. For example, the reflector 8 may include an electrode finger having a width other than the widths of the first electrode finger 8a and the second electrode finger 8b.

Distances between centers of the electrode fingers of the reflector 8 are all equal or substantially equal. Note that the distances between the centers of the electrode fingers of the reflector 8 may not necessarily all be equal or substantially equal. Preferably, the distances between centers of four consecutive electrode fingers including both of the first electrode finger 8a and the second electrode finger 8b are equal or substantially equal.

The reflector 9 is configured similarly to the reflector 8. More specifically, the plurality of electrode fingers of the reflector 9 include a first electrode finger 9a and a second electrode finger 9b having different widths. The first electrode finger 9a and the second electrode finger 9b are alternately arranged. With this, arrays A1 of sets of electrode fingers of the reflector 9 are periodically arranged. Note that an array A1 of a set of electrode fingers of the reflector 9 is an array including the first electrode finger 9a and the second electrode finger 9b.

The present preferred embodiment includes the following structure. 1) The IDT electrode 7, the reflector 8, and the reflector 9 are provided on the piezoelectric substrate 2 including the piezoelectric layer 6 preferably made of a lithium tantalite film, for example, and SH waves are used as a principal mode. 2) Four consecutive electrode fingers, which are any four of the electrode fingers of the reflector 8, include both of the first electrode finger 8a and the second electrode finger 8b, and the distances between the centers of the four consecutive electrode fingers are equal or substantially equal. 3) Four consecutive electrode fingers, which are any four of the electrode fingers of the reflector 9, include both of the first electrode finger 9a and the second electrode finger 9b, and the distances between the centers of the four consecutive electrode fingers are equal or substantially equal. The above structure enables a spurious response due to Rayleigh waves to be reduced or prevented. This is described below by making a comparison between the present preferred embodiment and a comparative example.

A plurality of acoustic wave devices each having the structure of the first preferred embodiment were fabricated with the width of the second electrode finger of the reflector varied. On the other hand, an acoustic wave device of a comparative example having a structure similar to that of the acoustic wave device of the first preferred embodiment was fabricated, except that the widths of the electrode fingers of the reflector are all equal or substantially equal.

Here, the conditions of the acoustic wave devices having the structure of the first preferred embodiment and the acoustic wave device of the comparative example are as follows. Note that the wavelengths of the IDT electrode and the reflectors described further below are wavelengths each defined by the distance between the centers of the electrode fingers. When the IDT electrode is viewed in an acoustic wave propagation direction, an area where adjacent electrode fingers intersect with each other is an intersecting area of the IDT electrode, and the length of the intersecting area along a direction in which the electrode fingers extend is an intersecting width.

Piezoelectric layer: material: lithium tantalate ($LiTaO_3$); cut angle: Y cut 55°; film thickness: about 400 nm Low acoustic velocity film: material: silicon oxide ($SiO_2$); film thickness: about 400 nm High acoustic velocity film: material: silicon nitride (SiN); film thickness: about 500 nm Support substrate: material: silicon (Si)

Figure 5:
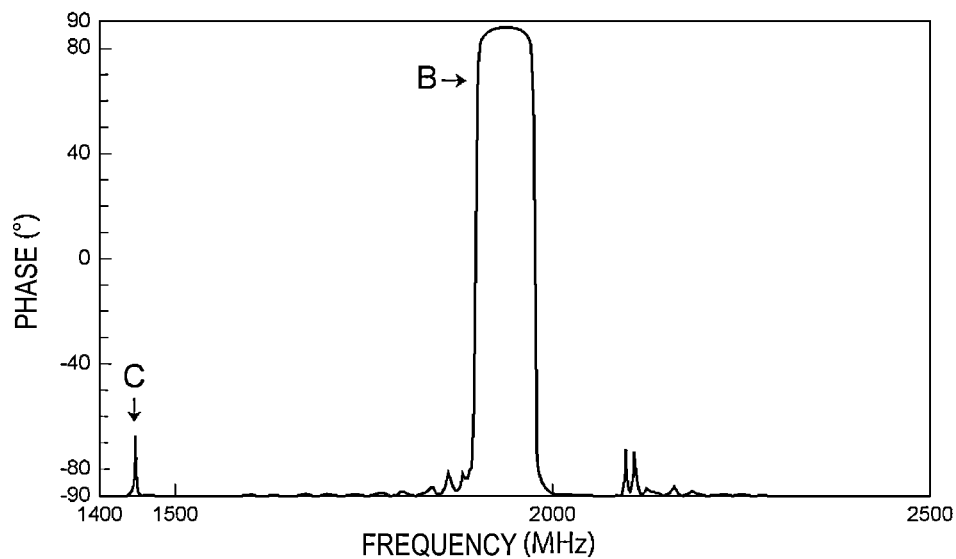
FIG. 5 is a diagram showing the phase of a principal mode and the phase of a spurious response in a comparative example.

Film thickness of each metal layer of IDT electrode: film thickness of Ti layer: about 4 nm; film thickness of Al layer: about 100 nm; film thickness of Ti layer: about 4 nm Wavelength of the IDT electrode: about 2 μm Intersecting width of the IDT electrode: about 20 μm Number of pairs of electrode fingers of the IDT electrode;
Number of electrode fingers of the IDT electrode: 50 pairs, 101 electrode fingers Width of each electrode finger of the IDT electrode: about 0.5 μm Film thickness of each metal layer of the reflector: film thickness of Ti layer: about 4 nm; film thickness of Al layer: about 100 nm; film thickness of Ti layer: about 4 nm Wavelength of the reflector: about 2 μm Number of electrode fingers of the reflector: 21 electrode fingers Width of each first electrode finger: about 0.5 μm Here, as acoustic wave devices having the structure of the first preferred embodiment, acoustic wave devices with the respective widths of the second electrode finger of the reflector being about 0.4 μm and about 0.3 μm were fabricated. As a comparative example, an acoustic wave device with the width of the second electrode finger of the reflector being about 0.5 μm, which is equal to the width of the first electrode finger, was fabricated. Next, the phase of the principal mode and the phase of a spurious response due to Rayleigh waves of each acoustic wave device were measured. FIG. 5 described below shows the phases in the comparative example. Note that in the first preferred embodiment and the comparative example having a similar structure, except for the width of the second electrode finger, the resonant frequency of the principal mode, and the frequency of a spurious response due to Rayleigh waves are equal or substantially equal.

FIG. 5 is a diagram showing the phase of the principal mode and the phase of a spurious response in the comparative example.

In FIG. 5, an arrow B indicates an SH wave as a principal mode, and an arrow C indicates a spurious response due to Rayleigh waves. It was discovered that a spurious response due to Rayleigh waves occurs in a frequency band in the vicinity of 0.75 times as large as the resonant frequency of the principal mode.

Figure 6:
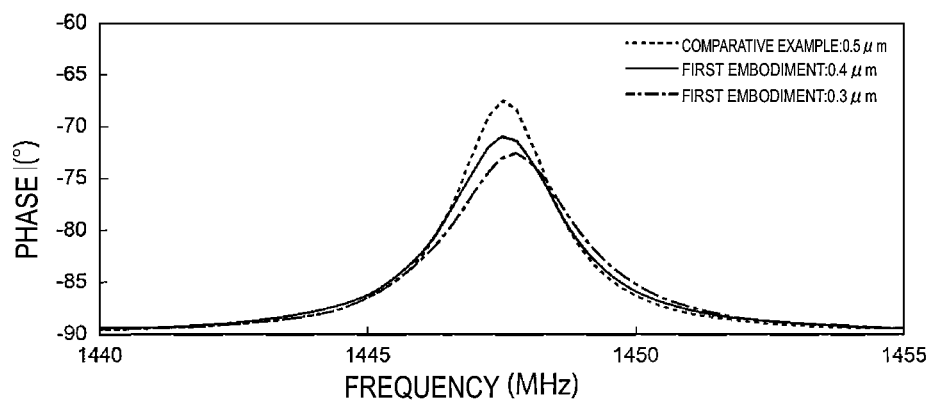
FIG. 6 is a diagram showing the phase of a spurious response in the first preferred embodiment of the present invention and the comparative example.

FIG. 6 is a diagram showing the phase of a spurious response in the first preferred embodiment and the comparative example. A solid line in FIG. 6 indicates the result of the first preferred embodiment when the width of the second electrode finger of the reflector is about 0.4 μm. A one-dot-chain line indicates the result of the first preferred embodiment when the width of the second electrode finger of the reflector is about 0.3 μm. A broken line indicates the result of the comparative example.

As shown in FIG. 6, it was discovered that a spurious response due to Rayleigh waves is smaller in the first preferred embodiment indicated by the solid line and the one-dot-chain line than in the comparative example indicated by the broken line. Thus, it was discovered that a spurious response due to Rayleigh waves can be reduced or prevented in the first preferred embodiment.

Furthermore, it was discovered that in the first preferred embodiment, a spurious response is smaller in the case in which the width of the second electrode finger is about 0.3 μm than in the case in which it is about 0.4 μm. In this manner, a spurious response due to Rayleigh waves can be further reduced or prevented as a difference between the width of the first electrode finger and the width of the second electrode finger is larger.

Rayleigh waves are displaced for each electrode finger. Rayleigh waves have components in a depth direction and components in an acoustic wave propagation direction with respect to the piezoelectric layer. In the first preferred embodiment shown in FIG. 1, four electrode fingers of the reflector 8 which are consecutive in the acoustic wave propagation direction include the first electrode finger 8a and the second electrode finger 8b having different widths. The same applies to the reflector 9. This enables the mode of Rayleigh waves to be asymmetric in the acoustic wave propagation direction. Therefore, a spurious response due to Rayleigh waves can be reduced or prevented.

Figure 7:
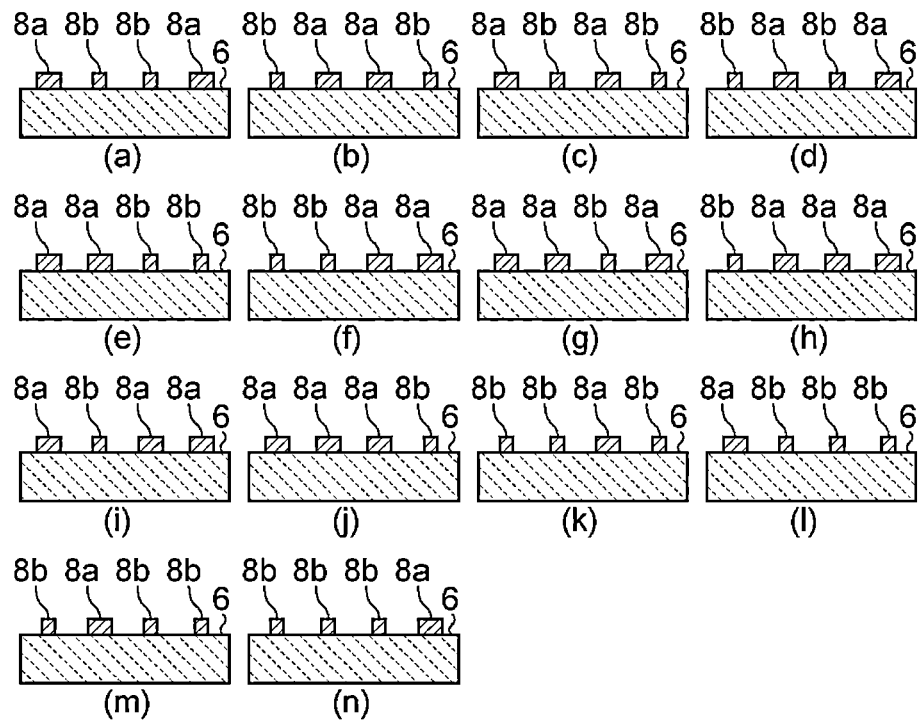
FIG. 7 is a schematic view showing examples of an array of a set of electrode fingers of the reflector in a preferred embodiment of the present invention.

In the first preferred embodiment, the array A1 of a set of electrode fingers of the reflector 8 is an array in order of, from a left side in FIG. 3, the first electrode finger 8a, the second electrode finger 8b, the first electrode finger 8a, and the second electrode finger 8b. However, the array A1 of a set of electrode fingers only needs to include both of the first electrode finger 8a and the second electrode finger 8b, and may be any of (a) to (n) in FIG. 7. In the following, an example of the array A1 of a set of electrode fingers in FIG. 7 is described. Note that the array below is an array in order from a left side in FIG. 7:

(a) first electrode finger 8a, second electrode finger 8b, second electrode finger 8b, first electrode finger 8a;

(b) second electrode finger 8b, first electrode finger 8a, first electrode finger 8a, second electrode finger 8b;

(c) first electrode finger 8a, second electrode finger 8b, first electrode finger 8a, second electrode finger 8b;

(d) second electrode finger 8b, first electrode finger 8a, second electrode finger 8b, first electrode finger 8a;

(e) first electrode finger 8a, first electrode finger 8a, second electrode finger 8b, second electrode finger 8b;

(f) second electrode finger 8b, second electrode finger 8b, first electrode finger 8a, first electrode finger 8a;

(g) first electrode finger 8a, first electrode finger 8a, second electrode finger 8b, first electrode finger 8a;

(h) second electrode finger 8b, first electrode finger 8a, first electrode finger 8a, first electrode finger 8a;

(i) first electrode finger 8a, second electrode finger 8b, first electrode finger 8a, first electrode finger 8a;

(j) first electrode finger 8a, first electrode finger 8a, first electrode finger 8a, second electrode finger 8b;

(k) second electrode finger 8b, second electrode finger 8b, first electrode finger 8a, second electrode finger 8b;

(l) first electrode finger 8a, second electrode finger 8b, second electrode finger 8b, second electrode finger 8b;

(m) second electrode finger 8b, first electrode finger 8a, second electrode finger 8b, second electrode finger 8b; and (n) second electrode finger 8b, second electrode finger 8b, second electrode finger 8b, first electrode finger 8a.

In each of the reflector 8 and the reflector 9, it is preferable that the arrays A1 of sets of electrode fingers are periodically arranged. As in the first preferred embodiment, it is more preferable that the arrays A1 of sets of electrode fingers are consecutively arranged. In this case, in the acoustic wave propagation direction, the mode of Rayleigh waves can be more reliably made asymmetric. Therefore, a spurious response due to Rayleigh waves can be more effectively reduced or prevented.

In each of the IDT electrode 7, the reflector 8, and the reflector 9, the distances between the centers of the electrode fingers are preferably all equal or substantially equal. With this, while variations in characteristics of the principal mode are reduced or prevented, a spurious response due to Rayleigh waves can be reduced or prevented in a manner as described above.

The distance between the centers of the electrode fingers of the IDT electrode 7 and the distances between the centers of the electrode fingers of the reflector 8 and the reflector 9 are more preferably all equal or substantially equal. With this, the wavelength of response due to Rayleigh waves and the distances between the centers of the electrode fingers of the reflector 8 and the reflector 9 can be made uniform or substantially uniform. Therefore, with the mode of Rayleigh waves being asymmetric as described above, Rayleigh waves can be even more effectively reduced or prevented.

The widths of the plurality of electrode fingers 7a of the IDT electrode 7 are preferably all equal or substantially equal. Also in this case, while variations in characteristics of the principal mode are reduced or prevented, a spurious response due to Rayleigh waves can be reduced or prevented.

Meanwhile, the IDT electrode 7 is often required to have a specific electrostatic capacitance. With the widths of the plurality of electrode fingers 7a of the IDT electrode 7 all being equal or substantially equal, in the entire IDT electrode 7, while narrowing a gap between adjacent electrode fingers 7a is reduced or prevented, the specific electrostatic capacitance can be obtained. Therefore, while deterioration in surge resistance is reduced or prevented, the specific electrostatic capacitance can be obtained.

The piezoelectric substrate 2 of the first preferred embodiment is a multilayer body including the support substrate 3, the high acoustic velocity film 4, the low acoustic velocity film 5, and the piezoelectric layer 6 laminated in this order, but is not limited to this. In the following, first to third modified examples of the first preferred embodiment each having a structure similar to that of the first preferred embodiment, except the piezoelectric substrate are described. Also in the first to third modified examples, as with the first preferred embodiment, a spurious response due to Rayleigh waves can be reduced or prevented.

Figure 8:
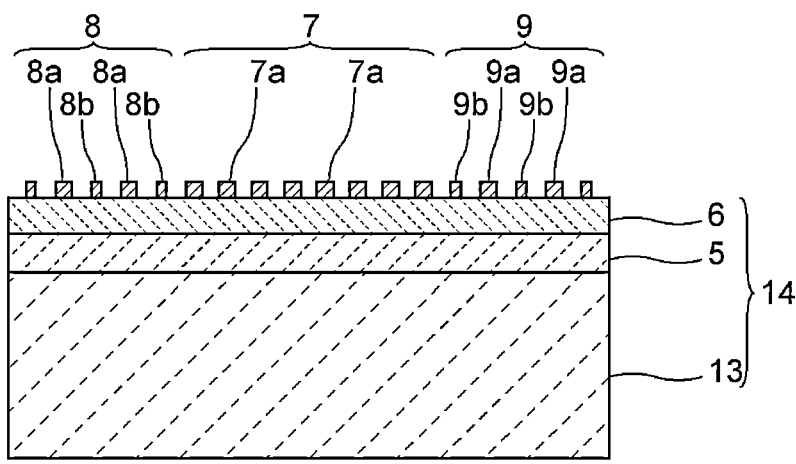
FIG. 8 is a schematic elevational sectional view of an acoustic wave device according to a first modified example of the first preferred embodiment of the present invention.

A piezoelectric substrate 14 in the first modified example shown in FIG. 8 includes a high acoustic velocity substrate 13, the low acoustic velocity film 5 provided on the high acoustic velocity substrate 13, and the piezoelectric layer 6 provided on the low acoustic velocity film 5. The piezoelectric layer 6 is provided indirectly on the high acoustic velocity substrate 13 with the low acoustic velocity film 5 therebetween.

The high acoustic velocity substrate 13 is a substrate having a relative high acoustic velocity. More specifically, the acoustic velocity of bulk waves propagating through the high acoustic velocity substrate 13 is higher than the acoustic velocity of acoustic waves propagating through the piezoelectric layer 6. In the modified example, the high acoustic velocity substrate 13 is a silicon substrate. Note that the material of the high acoustic velocity substrate 13 is not limited to the above and a medium including any of the following materials as a main component can also be used, such as, for example, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, DLC, diamond, and so forth.

The acoustic wave device of the present modified example includes the piezoelectric substrate 14, which is a multilayer body including the high acoustic velocity substrate 13, the low acoustic velocity film 5, and the piezoelectric layer 6 laminated in this order, and thus, as with the first preferred embodiment, energy of acoustic waves can be trapped on a piezoelectric layer 6 side.

Figure 9:
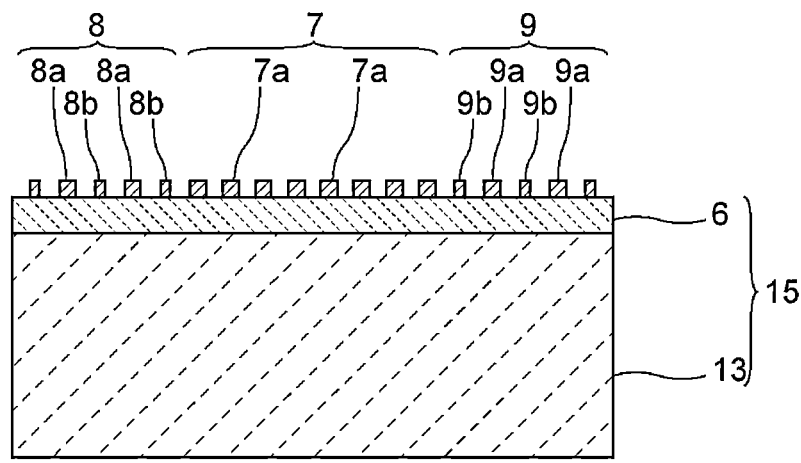
FIG. 9 is a schematic elevational sectional view of an acoustic wave device according to a second modified example of the first preferred embodiment of the present invention.

A piezoelectric substrate 15 in the second modified example shown in FIG. 9 includes the high acoustic velocity substrate 13 and the piezoelectric layer 6 provided directly on the high acoustic velocity substrate 13. Also in the present modified example, as with the first preferred embodiment, energy of acoustic waves can be trapped on a piezoelectric layer 6 side.

Figure 10:
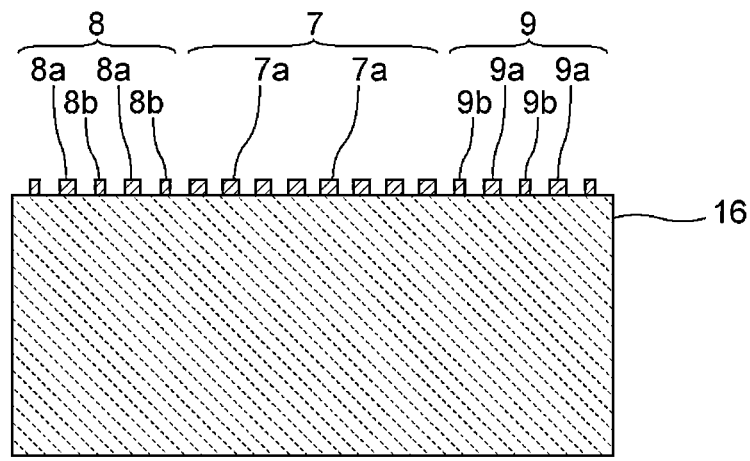
FIG. 10 is a schematic elevational sectional view of an acoustic wave device according to a third modified example of the first preferred embodiment of the present invention.

A piezoelectric substrate 16 in the third modified example shown in FIG. 10 is a lithium tantalate substrate including only a piezoelectric layer.

Figure 11:
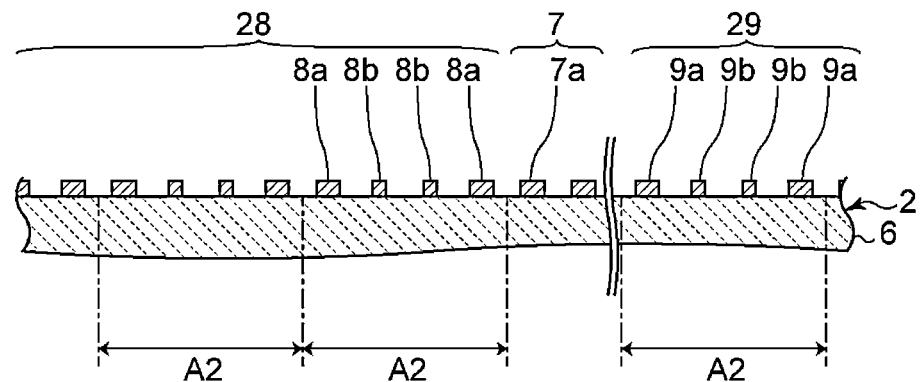
FIG. 11 is a schematic elevational sectional view depicting part of an IDT electrode and reflectors in a second preferred embodiment of the present invention.

FIG. 11 is a schematic elevational sectional view showing a portion of an IDT electrode and reflectors in a second preferred embodiment of the present invention.

The present preferred embodiment is different from the first preferred embodiment in an array A2 of a set of electrode fingers. More specifically, the array A2 of a set of electrode fingers is an array similar to (a) in FIG. 7. Arrays A2 of sets of electrode fingers of a reflector 28 are periodically arranged. The same applies to a reflector 29. Other than the above-described point, an acoustic wave device of the present preferred embodiment has a structure similar to that of the acoustic wave device 1 of the first preferred embodiment.

Here, a plurality of acoustic wave devices each having the structure of the present preferred embodiment were fabricated with the width of the second electrode finger of the reflector varied. Conditions of each acoustic wave device were similar to the above conditions of the first preferred embodiment with its result depicted in FIG. 6 for comparison. On the other hand, an acoustic wave device of a comparative example having a structure similar to that of the acoustic wave device of the present preferred embodiment was fabricated, except that the widths of the electrode fingers of the reflector are all equal or substantially equal. Note that the comparative example for comparison with the present preferred embodiment is similar to the above comparative example compared with the first preferred embodiment.

Figure 12:
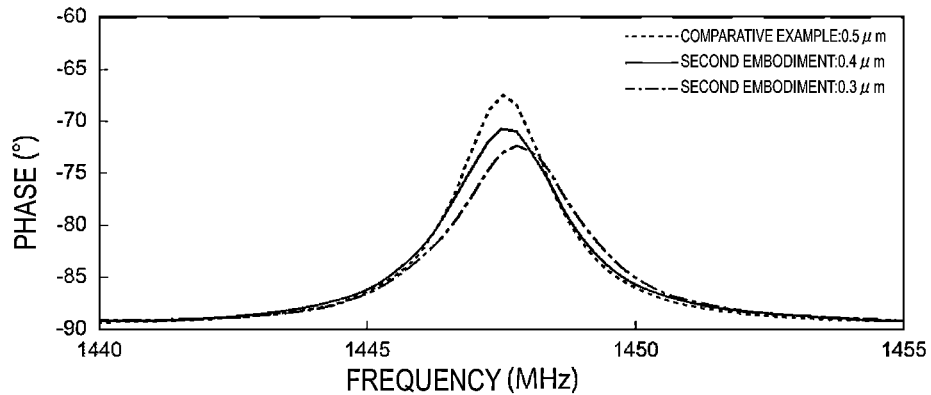
FIG. 12 is a diagram showing the phase of a spurious response in the second preferred embodiment of the present invention and the comparative example.

FIG. 12 is a diagram showing the phase of a spurious response in the second preferred embodiment and the comparative example. A solid line in FIG. 12 indicates the result of the second preferred embodiment when the width of the second electrode finger of the reflector is about 0.4 μm. A one-dot-chain line indicates the result of the second preferred embodiment when the width of the second electrode finger of the reflector is about 0.3 μm. A broken line indicates the result of the comparative example.

As shown in FIG. 12, it was discovered that a spurious response due to Rayleigh waves is smaller in the second preferred embodiment indicated by the solid line and the one-dot-chain line than in the comparative example indicated by the broken line. Thus, it can be found that a spurious response due to Rayleigh waves can be reduced or prevented in the second preferred embodiment. Furthermore, it was discovered that in the second preferred embodiment, a spurious response is smaller in the case in which the width of the second electrode finger is about 0.3 μm than in the case in which it is about 0.4 μm. In this manner, a spurious response due to Rayleigh waves can be effectively reduced or prevented if the array A2 of a set of electrode fingers is any of the examples shown in FIG. 7.

Figure 13:
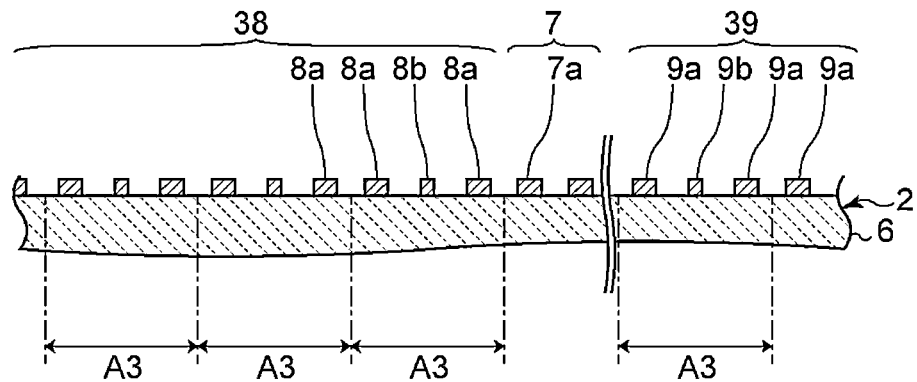
FIG. 13 is a schematic elevational sectional view showing a portion of an IDT electrode and reflectors in a third preferred embodiment of the present invention.

FIG. 13 is a schematic elevational sectional view showing a portion of an IDT electrode and reflectors in a third preferred embodiment of the present invention.

The present preferred embodiment is different from the first preferred embodiment in that an array A3 of a set of electrode fingers of a reflector 38 is an array of three consecutive electrode fingers including the first electrode finger 8a and the second electrode finger 8b. The same applies to a reflector 39. Other than the above-described point, an acoustic wave device of the present preferred embodiment has a structure the same as or similar to that of the acoustic wave device 1 of the first preferred embodiment.

The array A3 of a set of electrode fingers is an array in order of, from a left side in FIG. 13, the first electrode finger 8*a*, the second electrode finger 8*b*, and the first electrode finger 8*a*. Arrays A3 of sets of electrode fingers of the reflector 38 are periodically arranged. More specifically, the arrays A3 of sets of electrode fingers of the reflector 38 are consecutively arranged. Note that the array A3 of a set of electrode fingers is not limited to the above and is only required to include both of the first electrode finger 8*a* and the second electrode finger 8*b*. Also when the array A3 of a set of electrode fingers is an array of three consecutive electrode fingers, three consecutive electrode fingers, which are any three of the electrode fingers of the reflector 38, preferably include both of the first electrode finger 8*a* and the second electrode finger 8*b*.

Here, a plurality of acoustic wave devices each having the structure of the present preferred embodiment were fabricated with the width of the second electrode finger of the reflector varied. Conditions of each acoustic wave device were similar to the above conditions of the first preferred embodiment with its result depicted in FIG. 6 for comparison. On the other hand, an acoustic wave device of a comparative example having a structure similar to that of the acoustic wave device of the present preferred embodiment was fabricated except that the widths of the electrode fingers of the reflector are all equal. Note that the comparative example for comparison with the present preferred embodiment is similar to the above comparative example compared with the first preferred embodiment.

Figure 14:
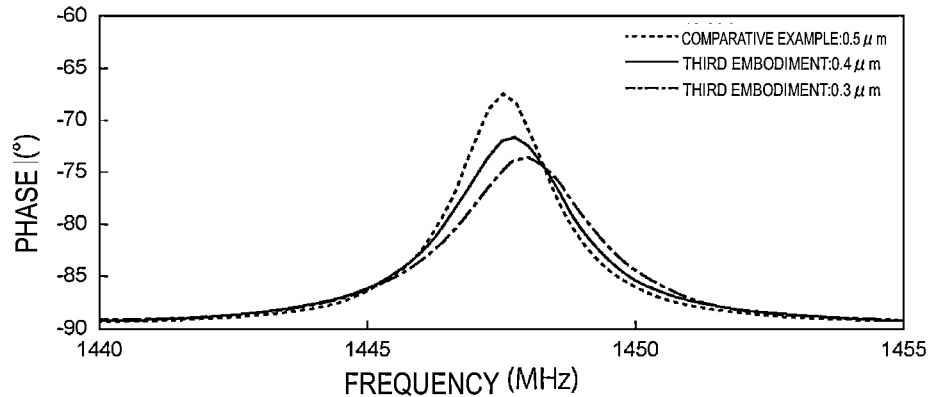
FIG. 14 is a diagram showing the phase of a spurious response in the third preferred embodiment of the present invention and the comparative example.

FIG. 14 is a diagram showing the phase of a spurious response in the third preferred embodiment and the comparative example. A solid line in FIG. 14 indicates the result of the third preferred embodiment when the width of the second electrode finger of the reflector is about 0.4 μm. A one-dot-chain line indicates the result of the third preferred embodiment when the width of the second electrode finger of the reflector is about 0.3 μm. A broken line indicates the result of the comparative example.

As shown in FIG. 14, it was discovered that a spurious response due to Rayleigh waves is smaller in the third preferred embodiment indicated by the solid line and the one-dot-chain line than in the comparative example indicated by the broken line. Thus, it was discovered that a spurious response due to Rayleigh waves can be reduced or prevented in the third preferred embodiment. Furthermore, it was discovered that in the third preferred embodiment, a spurious response is smaller in the case in which the width of the second electrode finger is about 0.3 μm than in the case in which it is about 0.4 μm.

The array A3 of a set of electrode fingers is not limited to an array of three consecutive electrode fingers as described in the present preferred embodiment or an array of four consecutive electrode fingers as described in the first preferred embodiment. If four consecutive electrode fingers, which are any four of the electrode fingers of the reflector 38, include both of the first electrode finger 8*a* and the second electrode finger 8*b*, the array A3 of a set of electrode fingers may be an array of five or more consecutive electrode fingers.

Figure 15:
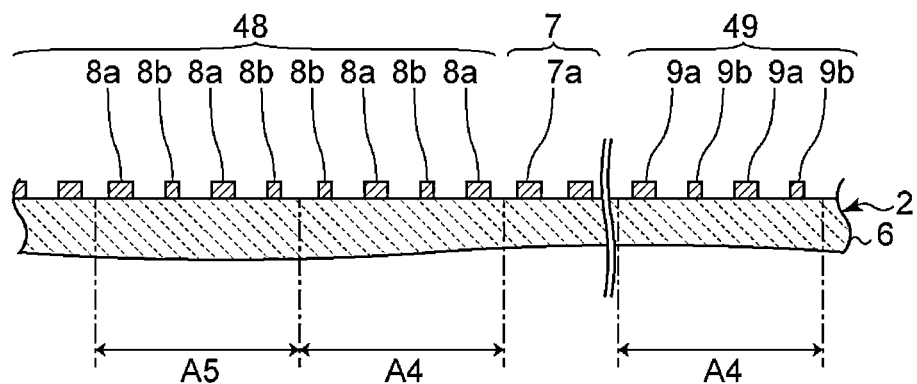
FIG. 15 is a schematic elevational sectional view showing a portion of an IDT electrode and reflectors in a fourth preferred embodiment of the present invention.

FIG. 15 is a schematic elevational sectional view showing a portion of an IDT electrode and reflectors in a fourth preferred embodiment of the present invention.

The present preferred embodiment is different from the first preferred embodiment in that arrays of two sets of electrode fingers of a reflector 48 are periodically arranged. More specifically, an array A4 of a set of electrode fingers of the reflector 48 and an array A5 of a set of electrode fingers of the reflector 48 are alternately arranged. The same applies to a reflector 49. Other than the above-described point, an acoustic wave device of the present preferred embodiment has a structure the same as or similar to that of the acoustic wave device 1 of the first preferred embodiment.

The array A4 of a set of electrode fingers is an array similar to (d) in FIG. 7. The array A5 of a set of electrode fingers is an array similar to (c) in FIG. 7. In the present preferred embodiment with the array A4 of a set of electrode fingers of the reflector 48 and the array A5 of a set of electrode fingers of the reflector 48 alternately arranged, arrays of eight consecutive electrode fingers are periodically arranged. Note that the number of sets is not limited to two and an array of three or more sets of electrode fingers of the reflector 48 may be periodically arranged.

Here, a plurality of acoustic wave devices each having the structure of the present preferred embodiment were fabricated with the width of the second electrode finger of the reflector varied. Conditions of each acoustic wave device were similar to the above conditions of the first preferred embodiment with its result depicted in FIG. 6 for comparison. On the other hand, an acoustic wave device of a comparative example having a structure similar to that of the acoustic wave device of the present preferred embodiment was fabricated except that the widths of the electrode fingers of the reflector are all equal. Note that the comparative example for comparison with the present preferred embodiment is similar to the above comparative example compared with the first preferred embodiment.

Figure 16:
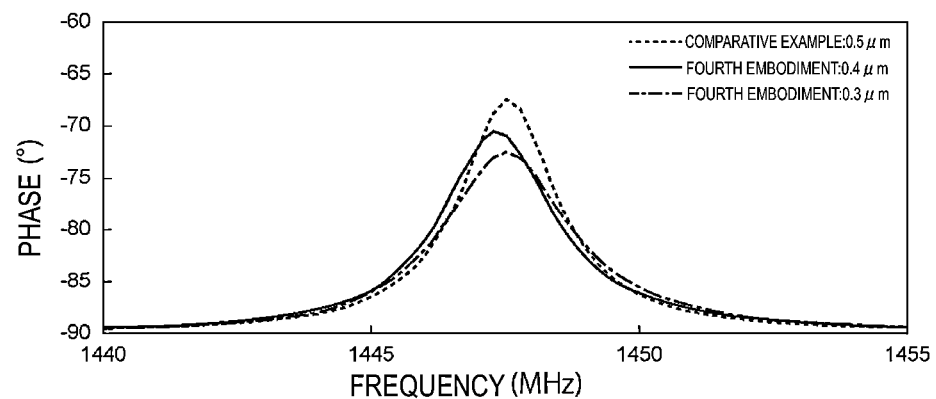
FIG. 16 is a diagram showing the phase of a spurious response in the fourth preferred embodiment of the present invention and the comparative example.

FIG. 16 is a diagram depicting the phase of a spurious response in the fourth preferred embodiment and the comparative example. A solid line in FIG. 16 indicates the result of the fourth preferred embodiment when the width of the second electrode finger of the reflector is about 0.4 μm. A one-dot-chain line indicates the result of the fourth preferred embodiment when the width of the second electrode finger of the reflector is about 0.3 μm. A broken line indicates the result of the comparative example.

As shown in FIG. 16, it was discovered that a spurious response due to Rayleigh waves is smaller in the fourth preferred embodiment indicated by the solid line and the one-dot-chain line than in the comparative example indicated by the broken line. Thus, it was discovered that a spurious response due to Rayleigh waves can be reduced or prevented in the fourth preferred embodiment. Furthermore, it was discovered that in the fourth preferred embodiment, a spurious response is smaller in the case in which the width of the second electrode finger is about 0.3 μm than in the case in which it is about 0.4 μm.

In the first to fourth preferred embodiments, examples of the acoustic wave resonator of the acoustic wave device according to preferred embodiments of the present invention have been described. In the following, a band pass filter, a duplexer, and a multiplexer according to preferred embodiments of the present invention are described.

Figure 17:
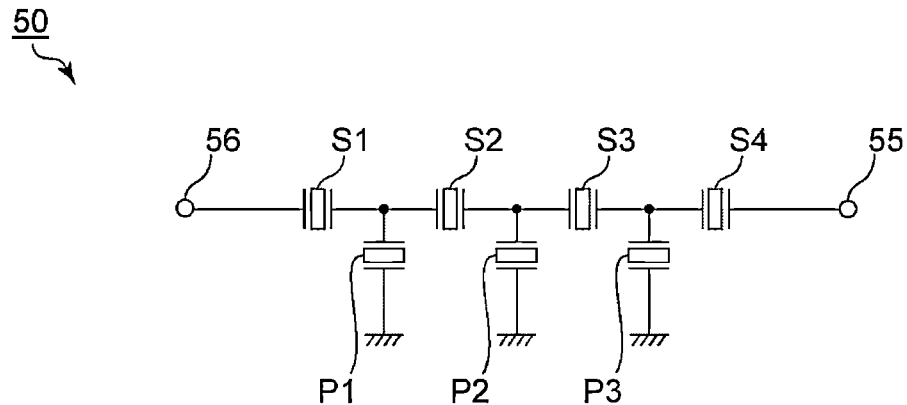
FIG. 17 is a circuit diagram of a band pass filter according to a fifth preferred embodiment of the present invention.

FIG. 17 is a circuit diagram of a band pass filter according to a fifth preferred embodiment of the present invention.

A band pass filter 50 is a ladder filter including a plurality of series arm resonators and a plurality of parallel arm resonators. Both of the plurality of series arm resonators and the plurality of parallel arm resonators are acoustic wave resonators. In the present preferred embodiment, both of the plurality of series arm resonators and the plurality of parallel arm resonators are the acoustic wave device 1 of the first preferred embodiment. Note that at least one of the plurality of acoustic wave resonators of the band pass filter 50 need to have the structure of an acoustic wave device according to a preferred embodiment of the present invention.

The band pass filter 50 is connected to a signal terminal 55 and an antenna terminal 56 connected to an antenna. Between the antenna terminal 56 and the signal terminal 55, a series arm resonator S1, a series arm resonator S2, a series arm resonator S3, and a series arm resonator S4 are connected in series. A parallel arm resonator P1 is connected between a ground potential and a node between the series arm resonator S1 and the series arm resonator S2. A parallel arm resonator P2 is connected between a ground potential and a node between the series arm resonator S2 and the series arm resonator S3. A parallel arm resonator P3 is connected between a ground potential and a node between the series arm resonator S3 and the series arm resonator S4. In the present preferred embodiment, an acoustic wave resonator closest to the antenna terminal side where the antenna terminal 56 is located is the series arm resonator S1.

Note that the circuit structure of the band pass filter 50 is not limited to the above and is only required to include a series arm resonator or a parallel arm resonator having the structure of an acoustic wave device according to a preferred embodiment of the present invention. The acoustic wave resonator closest to the antenna terminal side may be a parallel arm resonator, for example.

Each of the series arm resonators and the parallel arm resonators of the band pass filter 50 has the structure of the first preferred embodiment. This enables reduction or prevention of a spurious response due to Rayleigh waves.

When the band pass filter is connected to the antenna terminal in common with another filter device, a spurious response due to Rayleigh waves occurring in the acoustic wave resonators of the band pass filter may have an influence on the other filter device. By contrast, in the present preferred embodiment, the acoustic wave resonators of the band pass filter 50 has the structure of the first preferred embodiment. Thus, influences of a spurious response due to Rayleigh waves on the other filter connected in common can be reduced or prevented.

Of the influences of a spurious response of the band pass filter 50 on the other filter device connected in common to the band pass filter 50, the influences of a spurious response of the acoustic wave resonator closest to the antenna terminal side are the largest. As in the present preferred embodiment, it is preferable that the acoustic wave resonator closest to the antenna terminal side has the structure of an acoustic wave device according to a preferred embodiment of the present invention. With this, the influences of a spurious response due to Rayleigh waves on the other filter device connected in common to the band pass filter 50 can be more effectively reduced or prevented.

Figure 18:
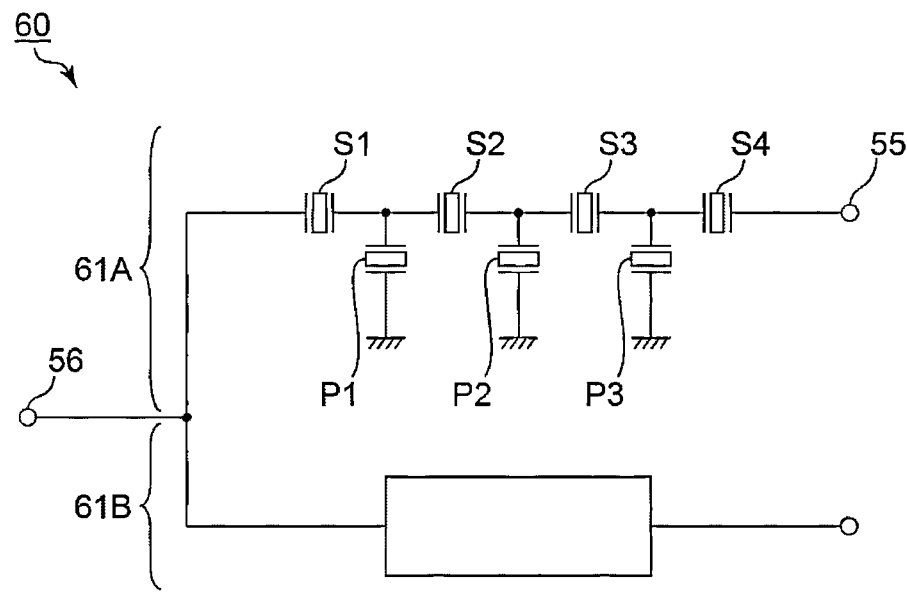
FIG. 18 is a schematic circuit diagram of a duplexer according to a sixth preferred embodiment of the present invention.

FIG. 18 is a schematic circuit diagram of a duplexer according to a sixth preferred embodiment of the present invention. In FIG. 18, a second band pass filter described further below is schematically shown by a block diagram.

A duplexer 60 includes the antenna terminal 56 and a first band pass filter 61A, and a second band pass filter 61B connected in common to the antenna terminal 56. The first band pass filter 61A and the second band pass filter 61B have different pass bands. In the present preferred embodiment, the first band pass filter 61A has a structure the same as or similar to the structure of the band pass filter 50 of the fourth preferred embodiment.

On the other hand, the circuit structure of the second band pass filter 61B is not particularly limited. The second band pass filter 61B may be, for example, an appropriate ladder filter or a longitudinally coupled resonator acoustic wave filter. Note that both of the first band pass filter 61A and the second band pass filter 61B may have the structure of a band pass filter according to a preferred embodiment of the present invention.

The first band pass filter 61A of the duplexer 60 has a structure the same as or similar to that of the fourth preferred embodiment. Thus, a spurious response due to Rayleigh waves can be reduced or prevented. Furthermore, the influences of a spurious response due to Rayleigh waves on the second band pass filter 61B connected to the antenna terminal 56 in common with the first band pass filter 61A can be reduced or prevented.

Figure 19:
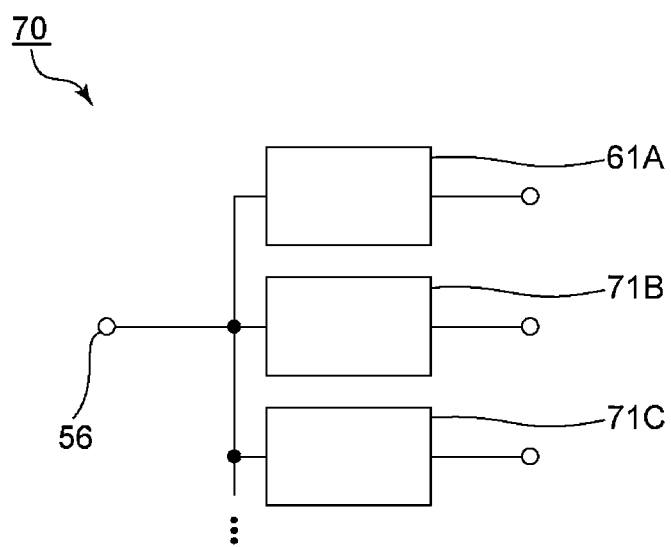
FIG. 19 is a schematic diagram of a multiplexer according to a seventh preferred embodiment of the present invention.

FIG. 19 is a schematic diagram of a multiplexer according to a seventh preferred embodiment of the present invention.

A multiplexer 70 includes the antenna terminal 56, and the first band pass filter 61A, a second band pass filter 71B, and a third band pass filter 71C connected in common to the antenna terminal 56. The first band pass filter 61A has a structure the same as or similar to that of the fourth preferred embodiment. On the other hand, the circuit structures of the second band pass filter 71B and the third band pass filter 71C are not particularly limited. The second band pass filter 71B and the third band pass filter 71C may each also have a structure of a band pass filter according to a preferred embodiment the present invention. Note that the multiplexer 70 may include a filter device connected to the antenna terminal 56, other than the first band pass filter 61A, the second band pass filter 71B, and the third band pass filter 71C.

The first band pass filter 61A of the multiplexer 70 has ae structure the same as or similar to that of the fourth preferred embodiment. Thus, a spurious response due to Rayleigh waves can be reduced or prevented. Furthermore, the influences of a spurious response due to Rayleigh waves on another filter device connected to the antenna terminal 56 in common with the first band pass filter 61A can be reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device comprising:
 a piezoelectric substrate including a piezoelectric layer made of lithium tantalate;
 an IDT electrode on the piezoelectric substrate; and
 a pair of reflectors on both sides of the IDT electrode on the piezoelectric substrate in an acoustic wave propagation direction; wherein
 SH waves are used as a principal mode;
 the IDT electrode includes a plurality of electrode fingers and the reflectors each include a plurality of electrode fingers;
 when a length along a direction orthogonal or substantially orthogonal to a direction in which the plurality of electrode fingers extend is a width, each of the reflectors includes a first electrode finger and a second electrode finger having different widths;
 four consecutive electrode fingers, which are any four of the plurality of electrode fingers of each of the reflectors, include both of the first electrode finger and the second electrode finger, and distances between centers of the four consecutive electrode fingers are equal or substantially equal; and when an array of the four consecutive electrode fingers of each of the reflectors that include the first electrode finger and the second electrode finger is an array of a set of electrode fingers, the array of the set of electrode fingers of the each of reflectors is periodically positioned.

2. The acoustic wave device according to claim 1, wherein widths of the plurality of electrode fingers of the IDT electrode are all equal or substantially equal.

3. The acoustic wave device according to claim 1, wherein the piezoelectric substrate includes a high acoustic velocity substrate;

the piezoelectric layer is directly or indirectly on the high acoustic velocity substrate; and an acoustic velocity of a bulk wave propagating through the high acoustic velocity substrate is higher than an acoustic velocity of an acoustic wave propagating through the piezoelectric layer.

4. The acoustic wave device according to claim 3, wherein the piezoelectric substrate includes a low acoustic velocity film between the high acoustic velocity substrate and the piezoelectric layer; and an acoustic velocity of a bulk wave propagating through the low acoustic velocity film is lower than an acoustic velocity of a bulk wave propagating through the piezoelectric layer.

5. The acoustic wave device according to claim 1, wherein the piezoelectric substrate includes a support substrate, a high acoustic velocity film on the support substrate, and a low acoustic velocity film on the high acoustic velocity film;

the piezoelectric layer is on the low acoustic velocity film;

an acoustic velocity of bulk wave propagating through the low acoustic velocity film is lower than an acoustic velocity of a bulk wave propagating through the piezoelectric layer; and an acoustic velocity of bulk wave propagating through the high acoustic velocity film is higher than an acoustic velocity of an acoustic wave propagating through the piezoelectric layer.

6. A band pass filter comprising:

a plurality of acoustic wave resonators including a series arm resonator and a parallel arm resonator; wherein at least one of the plurality of acoustic wave resonators is the acoustic wave device according to claim 1.

7. The band pass filter according to claim 6, wherein the band pass filter is connected to an antenna; and one of the plurality of acoustic wave resonators that is closest to an antenna terminal side is the acoustic wave device.

8. A duplexer comprising:

an antenna terminal connected to an antenna; and a first band pass filter and a second band pass filter connected in common to the antenna terminal and having different pass bands; wherein at least one of the first band pass filter and the second band pass filter is the band pass filter according to claim 6.

9. A multiplexer comprising:

an antenna terminal connected to an antenna; and a plurality of band pass filters connected in common to the antenna terminal and having different pass bands; wherein at least one of the plurality of band pass filters is the band pass filter according to claim 6.

10. The acoustic wave device according to claim 1, wherein distances between centers of the plurality of electrode fingers of the IDT electrode are all equal or substantially equal, and distances between centers of the plurality of electrode fingers of each of the reflectors are all equal or substantially equal.

11. The acoustic wave device according to claim 1, wherein widths of the plurality of electrode fingers of the IDT electrode are all equal or substantially equal.

12. An acoustic wave device comprising:

a piezoelectric substrate including a piezoelectric layer made of lithium tantalate;

an IDT electrode on the piezoelectric substrate; and a pair of reflectors on both sides of the IDT electrode on the piezoelectric substrate in an acoustic wave propagation direction; wherein SH waves are used as a principal mode;

the IDT electrode includes a plurality of electrode fingers and the reflectors each include a plurality of electrode fingers;

when a length along a direction orthogonal or substantially orthogonal to a direction in which the plurality of electrode fingers extend is a width, each of the reflectors includes a first electrode finger and a second electrode finger having different widths;

four consecutive electrode fingers, which are any four of the plurality of electrode fingers of each of the reflectors, include both of the first electrode finger and the second electrode finger, and distances between centers of the four consecutive electrode fingers are equal or substantially equal; and when an array of consecutive three of the electrode fingers of each of the reflectors that include the first electrode finger and the second electrode finger is an array of a set of electrode fingers, the array of the set of electrode fingers of each of the reflector is periodically positioned.

13. The acoustic wave device according to claim 12, wherein distances between centers of the plurality of electrode fingers of the IDT electrode are all equal or substantially equal, and distances between centers of the plurality of electrode fingers of each of the reflectors are all equal or substantially equal.

14. The acoustic wave device according to claim 12, wherein widths of the plurality of electrode fingers of the IDT electrode are all equal or substantially equal.

15. An acoustic wave device comprising:

a piezoelectric substrate including a piezoelectric layer made of lithium tantalate;

an IDT electrode on the piezoelectric substrate; and a pair of reflectors on both sides of the IDT electrode on the piezoelectric substrate in an acoustic wave propagation direction; wherein SH waves are used as a principal mode;

the IDT electrode includes a plurality of electrode fingers and the reflectors each include a plurality of electrode fingers;

when a length along a direction orthogonal or substantially orthogonal to a direction in which the plurality of electrode fingers extend is a width, each of the reflectors includes a first electrode finger and a second electrode finger having different widths;

four consecutive electrode fingers, which are any four of the plurality of electrode fingers of each of the reflectors, include both of the first electrode finger and the second electrode finger, and distances between centers of the four consecutive electrode fingers are equal or substantially equal; and distances between centers of the plurality of electrode fingers of the IDT electrode are all equal or substantially equal, and distances between centers of the plurality of electrode fingers of each of the reflectors are all equal or substantially equal.

16. The acoustic wave device according to claim 15, wherein the distances between the centers of the plurality of electrode fingers of the IDT electrode and the distances between the centers of the plurality of electrode fingers of each of the reflectors are equal or substantially equal.

17. The acoustic wave device according to claim 16, wherein widths of the plurality of electrode fingers of the IDT electrode are all equal or substantially equal.

18. The acoustic wave device according to claim 15, wherein widths of the plurality of electrode fingers of the IDT electrode are all equal or substantially equal.

* * * * *